(12) United States Patent
Armschat et al.

(10) Patent No.: US 12,385,984 B2
(45) Date of Patent: Aug. 12, 2025

(54) MONITORING THE OPERATION OF AN ELECTRICAL COIL ASSEMBLY

(71) Applicant: Siemens Energy Global GmbH & Co. KG, Munich (DE)

(72) Inventors: Christoph Armschat, Erlangen (DE); Klaus Pointner, Linz (AT); Helmut Reisinger, St. Georgen/Gusen (AT)

(73) Assignee: Siemens Energy Global GmbH & Co. KG, Munich (DE)

( * ) Notice: Subject to any disclaimer, the term of this patent is extended or adjusted under 35 U.S.C. 154(b) by 290 days.

(21) Appl. No.: 18/252,074

(22) PCT Filed: Nov. 6, 2020

(86) PCT No.: PCT/EP2020/081289
§ 371 (c)(1),
(2) Date: May 8, 2023

(87) PCT Pub. No.: WO2022/096121
PCT Pub. Date: May 12, 2022

(65) Prior Publication Data
US 2023/0400531 A1    Dec. 14, 2023

(51) Int. Cl.
*G01R 31/52* (2020.01)
*G01R 31/62* (2020.01)
(Continued)

(52) U.S. Cl.
CPC ............. *G01R 31/52* (2020.01); *G01R 31/62* (2020.01); *G01R 31/72* (2020.01); *H02H 3/20* (2013.01)

(58) Field of Classification Search
None
See application file for complete search history.

(56) References Cited

U.S. PATENT DOCUMENTS 11,131,719 B2 * 9/2021 Armschat ................ H02H 3/44

FOREIGN PATENT DOCUMENTS

| CN | 206611355 U | 11/2017 |
|---|---|---|
| CN | 108226699 A | 6/2018 |

(Continued)

OTHER PUBLICATIONS

Krauss et al., Solid State Radio Engineering, Sep. 30, 1987, pp. 195-196, edition 15010•0712, Higher Education Press, Beijing, China.

(Continued)

*Primary Examiner* — Farhana A Hoque
(74) *Attorney, Agent, or Firm* — Laurence A. Greenberg; Werner H. Stemer; Ralph E. Locher

(57) ABSTRACT

A method for monitoring the operation of an electrical assembly having a plurality of coils disposed electrically in a parallel circuit, includes detecting, off-power, the voltage at each coil by using a tap on a winding, determining the AC component of the detected voltage for each coil, determining the mean value of the voltage at the coils, evaluating the determined AC component for each coil with respect to the determined mean voltage, while applying a weighting, and generating a signal if a weighted deviation of a value describing the AC component of a detected voltage in a coil from a value describing the mean voltage exceeds a specified limiting value. An electrical assembly and a method for operating the assembly are also provided.

17 Claims, 3 Drawing Sheets

(51) Int. Cl.
*G01R 31/72* (2020.01)
*H02H 3/20* (2006.01)

(56) References Cited

FOREIGN PATENT DOCUMENTS

| | | |
|---|---|---|
| CN | 110488187 A | 11/2019 |
| CN | 110581532 A | 12/2019 |
| CN | 111679163 A | 9/2020 |
| WO | WO 2019219196 A1 | 11/2019 |

OTHER PUBLICATIONS

Zhang Nan, Electrical Engineering, Jun. 30, 1996, pp. 195-196, edition 7-04-005674-7, Higher Education Press, Beijing, China.

\* cited by examiner

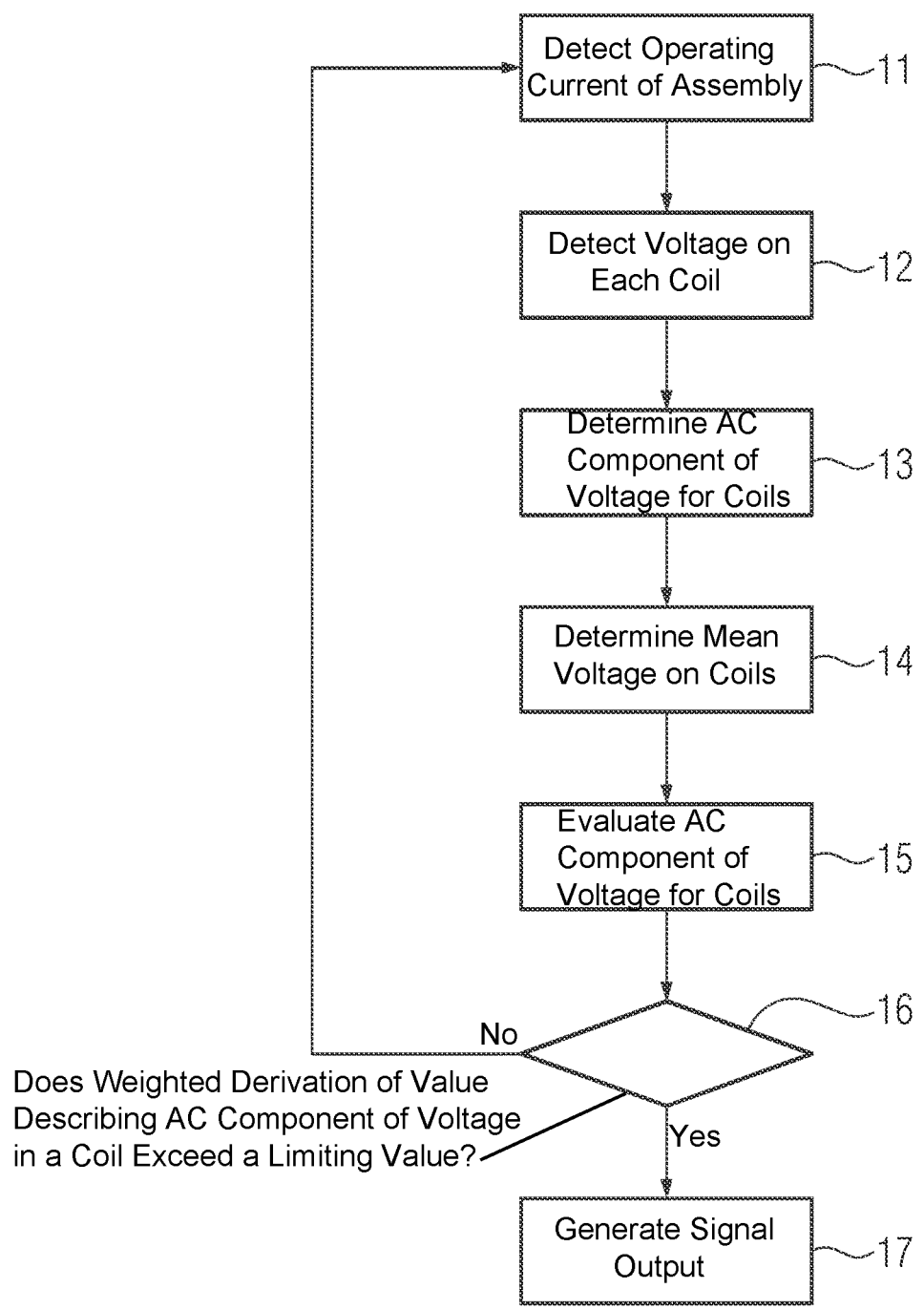

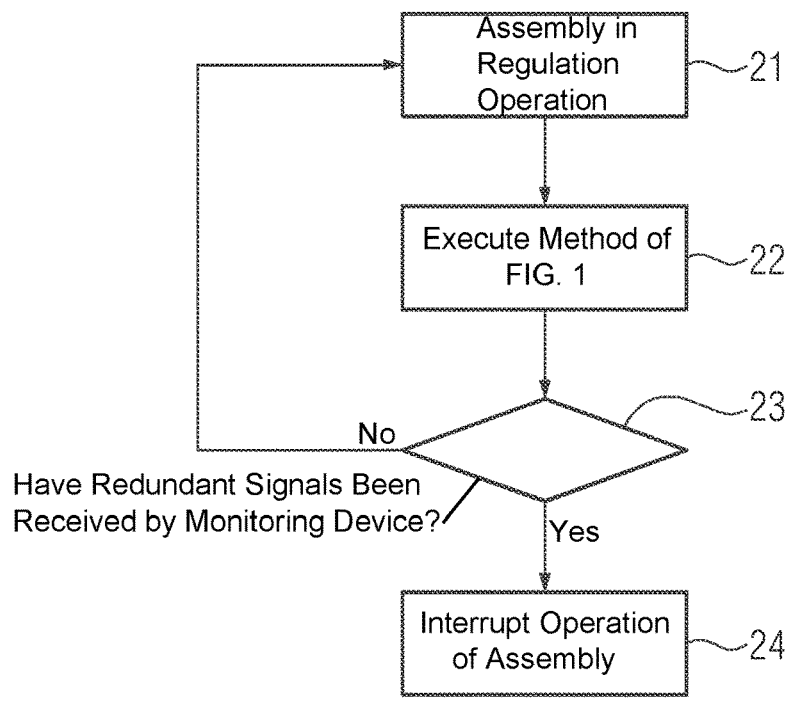
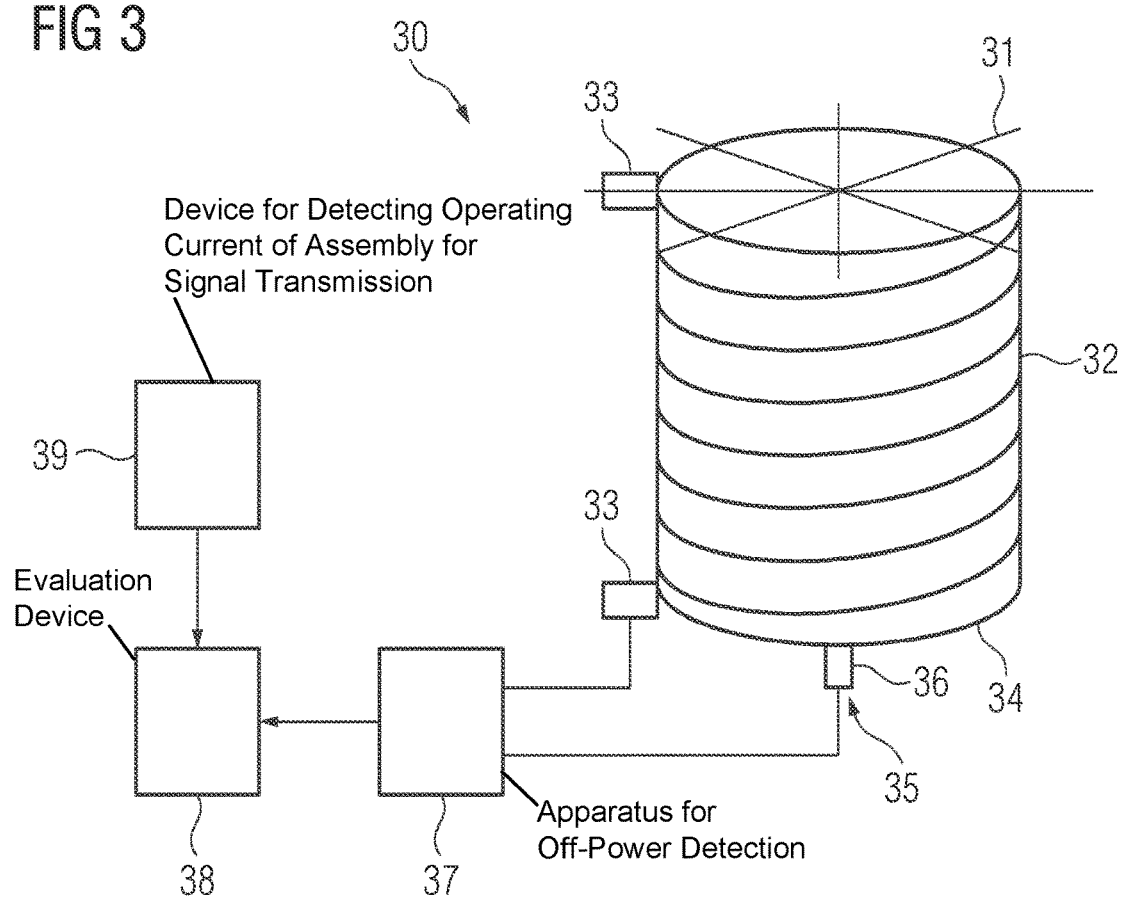

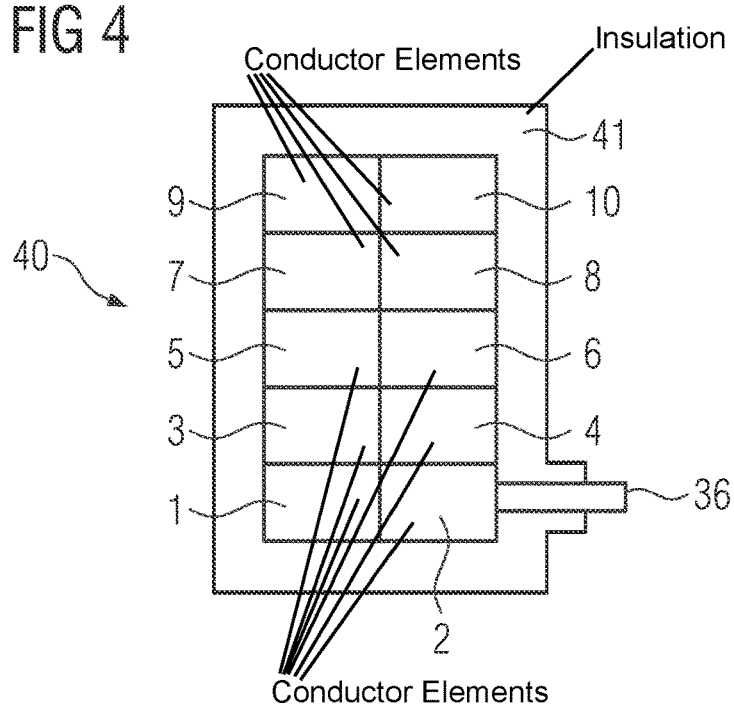
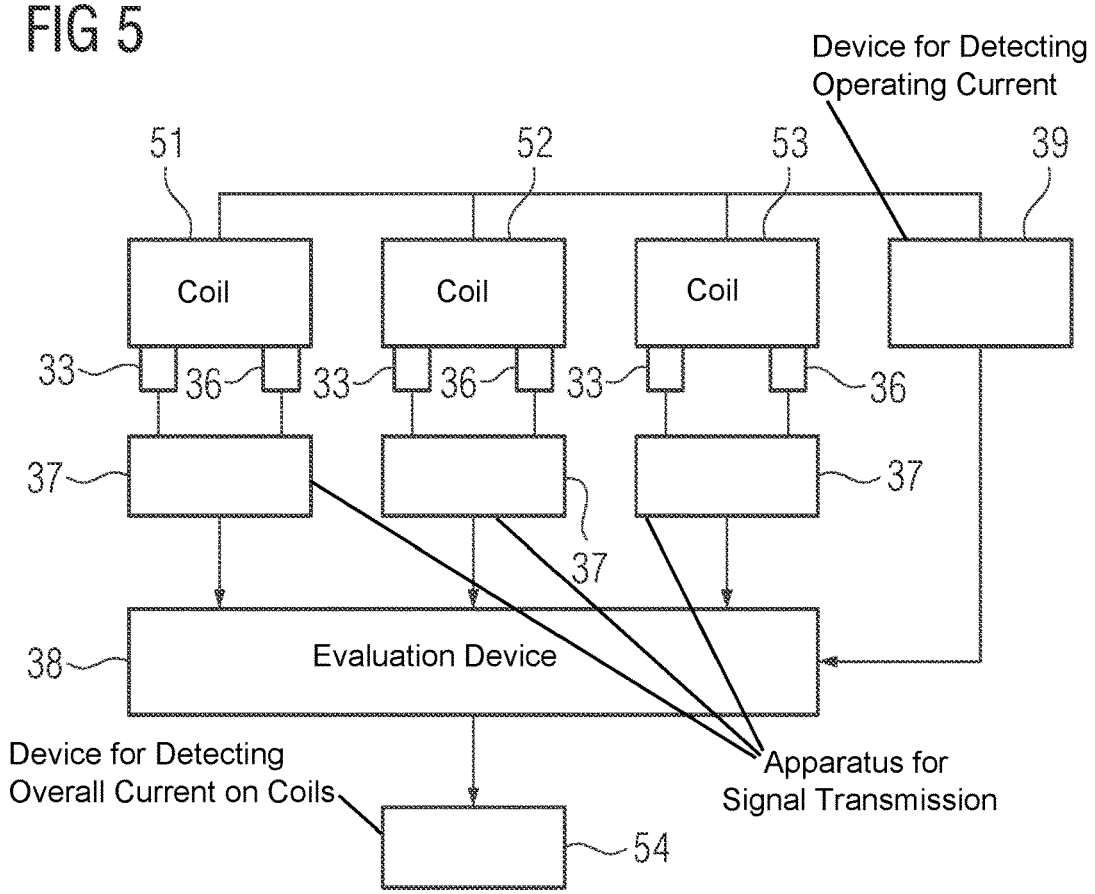

MONITORING THE OPERATION OF AN ELECTRICAL COIL ASSEMBLY

The present invention relates to a method for monitoring the operation of an electrical assembly, particularly a reactance coil assembly, having a plurality of coils or coil windings arranged electrically in a parallel circuit. The invention further relates to an electrical assembly, particularly a reactance coil assembly, and to a method for operating such an assembly.

Electrically parallel-connected coils are employed, for example, in conjunction with transformers or electrical reactance coils, for example air-core reactance coils, oil-insulated reactance coils or gas-insulated reactance coils. In coils of this type, in rare cases, winding short-circuits can occur. In order to prevent any further damage, particularly any resulting burn-out, for example a reactance coil burn-out, it is advantageous that a diagnosis of a winding short circuit should be executed as rapidly and as reliably as possible.

Document WO 2019/219196 A1 describes a method and an apparatus for detecting a winding short-circuit in coils arranged in a parallel circuit. For each of the coils in the parallel circuit, a difference is determined between the current flowing in the individual coils and a mean value of currents flowing in the coils. By reference to these current differences, the occurrence of a winding short-circuit in one of the coils is detected.

In addition to the detection of appropriate signals which reliably indicate a winding short-circuit, the reliable transmission of signals to corresponding monitoring units constitutes a challenge. The wireless transmission of signals is generally simple and cost-effective, but is also less reliable than hard-wired signal transmission. To date, protection-related data, findings or signals have been almost exclusively transmitted by a hard-wired arrangement, or using optical waveguides. At a HV potential, however, this wiring or installation of optical waveguides is cost-intensive. Radio sensors, which are employed for signal transmission, are fault-susceptible and, in particular, can be subject to failure if they are battery-powered. This lengthy chain of signal detection, digitization in radio sensor nodes, processing and transmission by means of a wireless module features numerous potential fault sources, such that radio technology alone is not reliable for protection-related functions. Acoustic signals can be corrupted by a background noise level. Optical signals can be corrupted by stray light or shadowing on the receiver. Although the wireless transmission of signals is nevertheless an attractive option, practically no association of redundant transmission paths has been achieved to date.

A reactance coil burn-out is typically triggered by a short-circuit in a winding, generally resulting from an insulation fault. In a reactance coil, which is generally comprised of a plurality of concentric turns of parallel-connected winding layers, an insulation fault will result in a short-circuit winding. This winding undergoes a very rapid heat-up, on the grounds of the high current which is induced by the magnetic field of the reactance coil. The winding insulation, depending upon the material composition thereof, can begin to burn. If the short-circuit winding is located in the interior of the reactance coil body, detection by means of ultraviolet light (UV light), using a fire detection installation, will not be effective. As a result of the slow response of the installation, associated with smoke generation, the entire reactance coil body can undergo such a severe heat-up in the interim that the fire cannot be independently extinguished. Particularly in the case of reactance coils which are installed in equipment rooms, severe fouling of equipment rooms can impair UV detection. There is, moreover, a risk of the transfer of fire to adjoining devices.

It is therefore desirable that a reliable early detection of a defective short-circuit winding should be provided. Additional optical monitoring systems, particularly involving optical waveguide transmission and dedicated evaluation units, are comparatively cost-intensive.

SUMMARY OF THE INVENTION

One object of the present invention is therefore the provision of a simple, secure and cost-effective option for the monitoring of an electrical assembly which comprises a plurality of coils arranged electrically in a parallel circuit. Further objects are the provision of an advantageous electrical assembly, and of a method for the operation thereof.

The first object is fulfilled by a method for monitoring the operation of an electrical assembly, for example a reactance coil assembly or a transformer assembly, having a plurality of coils or coil windings which are electrically arranged in a parallel circuit, as described below. Further objects are fulfilled by an electrical assembly having a plurality of coils or coil windings which are electrically arranged in a parallel circuit, as described below, and by a method for operating such an assembly, as described below. Further advantageous configurations of the invention are included in the dependent claims.

Hereinafter, the term "coils" is understood to include both spatially adjoining parallel coil windings, and coil windings which are arranged concentrically about one another.

The method according to the invention for monitoring the operation of an electrical assembly relates to an assembly which comprises a plurality of coils, arranged electrically in a parallel circuit. The assembly can be, for example, a reactance coil or a transformer. The assembly can comprise, for example, at least two or at least three coils, arranged electrically in a parallel circuit. During the regulation operation of the assembly, an electric current flows through the coils.

The method according to the invention comprises the following steps: at a tapping point or tap arranged on a winding, the voltage present on each coil is detected, in an off-power arrangement, for example by measurement. The alternating voltage component (AC component) of the respectively detected voltage is determined for each coil. A mean value of the voltage present on the coils is determined. The AC component of the voltage thus detected is evaluated for each coil, with respect to the mean voltage thus determined. A weighting is applied. Thereafter, a signal output is generated in the event of an overshoot of a specified limiting value by a weighted deviation of a value, which describes the AC component of a measured voltage in a coil, from a value which describes the mean voltage.

Preferably, in the context of the method, the operating current of the assembly is detected, and a weighting is applied by reference to the detected operating current. Alternatively, deviations in the individual coil voltages can be considered in relation to the absolute value of the present tap voltage measurement, for example in relation to the mean value of voltages measured on the taps. Any noise associated with small voltages or currents can thus be eliminated. Accordingly, any additional current measurement is superfluous, or is optional.

As a value which describes the AC component of a measured coil voltage, for example, the root mean square value and/or amplitude value and/or peak-to-peak value of the AC component and/or the temporal variation, i.e. the differential, of the deviation of the detected voltage from the mean value can be determined. As the value which describes the mean value of voltage, the mean value of the direct voltage component (DC component) of the voltage and/or the mean value of the root mean square values of the AC voltage components on the individual coils and/or the mean of amplitude values and/or the mean of peak-to-peak values and/or the temporal variation, i.e. the differential, of the mean voltage value can be determined. Consideration of the above-mentioned differentials provides an advantage, in that the accuracy of monitoring can thus be enhanced, and a very rapid detection of a winding short-circuit is possible, even in advance of the occurrence of the associated high currents.

The coils can be, for example, dry-insulated air-core coils, or fluid-insulated coils with an iron core, or gas-insulated coils, or a combination of these individual variants.

The method according to the invention provides an advantage, in that it permits the detection of a winding short-circuit before any detection of burn-out by means of conventional UV light sensors or infrared sensors or by means of a smoke detection system is possible. This permits early detection, as a result of which further damage to the assembly and, potentially, to further components is avoided. It is moreover possible to assign the winding short-circuit to a specific coil. This can then be replaced and/or repaired in a targeted manner, without the necessity for further diagnostic steps for the identification of the affected coil. In this manner, both time and costs are saved. Overall, the present invention permits cost-effective and efficient fault detection.

According to an advantageous variant, each of the coils comprises a main terminal. Preferably, off-power detection, for example by measurement, of the voltage present on each coil is executed between the main terminal and the tap. Preferably, the tap is arranged on a first winding, commencing from the main terminal. The tap is preferably arranged at a distance of less than one winding length, commencing from the main tap. The tap can be arranged, for example, at a distance of no more than two-thirds of the conductor length of the first winding, particularly in air-core coils, commencing from the main terminal. Preferably, the tap is arranged at approximately half a winding length, i.e. at a distance of one half of a winding length, commencing from the main terminal. As the voltage per winding of a reactance coil or a reactor is customarily of the order of 800 V, this configuration, by the employment of a (smaller) proportion of the first winding, permits a voltage which can still be effectively accommodated by a signal and voltage divider in electronics.

The tap is connected via a connecting terminal to a first winding of the coil, considered from the main terminal, in an electrically conductive manner. A corresponding connecting terminal provides an advantage, in that the tap can be connected or removed in a flexible manner. This is advantageous, for example, in the event of the replacement of a coil or a changeover of the tap connection, as this arrangement permits rapid and simple handling.

In a further variant, the assembly can comprise a bearing bracket, to which the coils are fastened. In this variant, taps are preferably configured such that insulated signal wires are led out of the coil taps in the direction of the bearing bracket, and are thus routed by the shortest possible insulated path to the bearing bracket, where they are connected to an electronic measurement circuit. This is also advantageous with respect to safety, as the voltage arising in this configuration, even under transient conditions, can be managed effectively.

As a rated AC voltage component, for example, 20 V AC can be tapped such that, in the event of an incoming transient overvoltage, the signal voltage, for example with voltage peaks ranging from 50 volts to several kilovolts, can be controlled by small surge arresters.

In a further variant, the alternating current component (AC component) of the operating current is detected. The term operating current is to be understood as the overall current flowing in the plurality of coils. The AC component of the operating current thus detected can be employed for weighting. Additionally or alternatively, the ratio of the deviation of the value which describes the AC component of a measured coil voltage from the value which describes the mean voltage, in relation to the AC component of the operating current, can be determined. If this ratio exceeds a stipulated limiting value, a signal output can be generated. By the consideration of the AC component of the operating current thus described, the accuracy of evaluation for small operating currents is enhanced and, at the same time, in the event of high operating currents, and in the interests of preventing any spurious estimates, a less refined evaluation with a higher tolerance margin is permitted.

In a further variant, the magnetic field of individual coils, particularly of individual coils configured in a spatially separated arrangement, can be measured, and the ratio of the magnetic field to the operating current and/or to the AC component of the operating current determined. If the ratio for a given coil achieves a stipulated threshold which is weighted, for example, according to the operating current, a signal output can be generated. Accordingly, any variation in the magnetic field of individual coils is interpreted as an indicator of the presence of a winding short-circuit, thereby enhancing the accuracy of evaluation.

Moreover, the signal describing the AC voltage component and/or a signal describing the AC component of the operating current detected can be rectified and/or smoothed. Smoothing can be executed, for example, with a specified time constant, for example a time constant of 300 milliseconds. In this manner, the meaningful quality of the signal is improved. Transients, i.e. extremely time-limited deviations, in the event of rectification and smoothing, will not trigger a spurious signal which results in the initiation of further measures.

Preferably, in the context of the method according to the invention, a signal output is transmitted via a plurality of redundant signal transmission paths to a monitoring device. This can be achieved e.g. by means of an optical waveguide and/or by acoustic transmission and/or by UV light transmission and/or by radio wave transmission. In this manner, it is possible to generate a plurality of redundant signal transmission paths, thereby ensuring a reliable and robust signal transmission.

In a further variant, by means of an induction coil, for example and air-core coil, energy can be recovered from an alternating field. This energy can be employed for the evaluation and/or for the generation of signals and/or for the transmission of signals. This configuration provides an advantage, in that a potentially fault-susceptible battery-powered operation of the monitoring method is avoided. Moreover, this configuration contributes to an improvement in the cost-efficiency of the method and in the assembly, and to a reduction in fault-susceptibility. Additionally, the complexity and costs associated with the retrofitting of a corresponding monitoring function are reduced. The cross-sectional surface of the induction coil can assume a diameter of between 10 cm and 20 cm, e.g. 15 cm. Alternatively, energy can be recovered by means of a saturable current converter, optionally with a DC pre-magnetization system in the iron core.

The electrical assembly according to the invention, which can be, for example, a reactance coil assembly or a transformer assembly, comprises a plurality of coils which are electrically arranged in a parallel circuit. In the context of the regulation operation of the assembly, an electric current flows through the coils. Each coil has a tap on one winding. The electrical assembly comprises an apparatus for the off-power detection, e.g. measurement, of the voltage which is present on each coil, by means of the tap and an evaluation device. The electrical assembly according to the invention is designed for the execution of an above-mentioned method according to the invention. The assembly according to the invention has the features and advantages described above with reference to the method according to the invention. Optionally, the assembly can comprise an apparatus for detecting the operating current of the assembly.

The evaluation device can be designed, for example, to detect the AC component of the respective measured voltage on each coil and/or to determine the mean value of the voltage which is present on the coils and/or to evaluate the AC component of the measured voltage on each coil in relation to the mean voltage value thus determined. The evaluation device can further be designed, in the context of evaluation, to apply a weighting, for example by means of the operating current or voltages detected. It can further be designed to generate a signal output, in the event that a weighted deviation of a value which describes the AC components of a measured voltage on a coil from a value which describes the mean voltage value exceeds a specified threshold value.

The assembly according to the invention can comprise at least two or at least three coils. The coils can be, for example, air-core coils or oil-insulated coils or gas-insulated coils. The coils can either be spatially arranged parallel to one another or arranged concentrically about one another (in a reactance coil of layered design). This means that an individual single-phase reactance coil, forming a physical and electrical unit (particularly an air-core reactance coil), on the basis of measurements in its individual concentric and parallel-connected layers, can also be monitored according to the concept described herein. The assembly can comprise at least one induction coil for energy recovery.

Preferably, each of the coils comprises a main terminal, and the tap is arranged on a first winding, considered from the main terminal of the coil. The apparatus for the off-power detection of the voltage which is present on each coil is preferably designed to detect the voltage between the main terminal and the tap. The tap can comprise a connecting terminal. The connecting terminal can be connected to the tapped winding of the coil. Advantageously, the tap is arranged at a maximum distance of two-thirds of the conductor length of the first winding, commencing from the main terminal, for example at a distance of approximately one half of the conductor length of the first winding.

The assembly can comprise a bearing bracket, to which the coils are fastened. The taps can be configured such that they are led out of the coils in the direction of the bearing bracket. Advantages associated herewith and further configuration features have been described above with reference to the method according to the invention.

The assembly can further comprise at least one signal-damping reactance coil and/or at least one surge arrester. The surge arrester can be connected down-circuit of the signal-damping reactance coil. Moreover, devices can be provided for the rectification and/or smoothing of AC signals.

The method according to the invention for operating an above-mentioned assembly is characterized in that operation of the assembly proceeds in a regulation manner, wherein an above-mentioned method according to the invention for monitoring the operation of the assembly is executed. Operation of the assembly is interrupted, for example the assembly is switched off, in the event that, in the context of the monitoring method, at least one signal output is delivered to a monitoring device, which signal output has been received by a monitoring device on at least two redundant transmission paths. In this manner, reliable and cost-effective fault detection, particularly detection of winding short-circuits, is possible.

In the context of the present invention, signals for the individual coils or individual layers are compared. In the event of an abrupt deviation of a coil or layer voltage from the mean layer voltage, this is an indicator of a layer short-circuit. The deviation is preferably weighted by the overall current or operating current of the assembly, for example of the reactance coil. If the overall current is high, the layer voltage deviation will need to be greater than in the case of a lower operating current, in order to permit the secure identification of a winding short-circuit. In an electronic circuit, a trigger signal is generated from the differential voltage, weighted by the operating current measurement, which then actuates an advantageously redundant and wireless transmission chain, which is routed through to the protection system or to a monitoring device. By the evaluation of differentials, a cost-effective and less accurate measurement technology can be employed. To this end, a differential comparison of measured voltages is executed, in a similar manner to an H-circuit of a Wheatstone bridge.

In principle, a distinction can be drawn between parallel-connected reactance coils and an individual reactance coil having a plurality of layers. Depending upon the instance of the defect in the short-circuited winding, individual layer currents, and thus also the layer voltages, at the tapping points will vary upon the occurrence of a fault, either differently or to a similar degree. A low-impedance fault is simple to detect, as only the current or voltage in the defective layer will vary, and the detection of the fault can be employed for the immediate execution of a switch-off. A high-impedance defect will result in smaller increases in the layer currents. Currents in the adjoining, fault-free layers of the assembly will also rise. In this case, a mutual comparison of layer currents and/or of layer voltages may not be a sufficient criterion for the execution of a switch-off. In this case, the layer current can be compared with an external current measurement in the same current path of the assembly and/or the current in coils on the adjoining phases can be employed for the evaluation of the fault and/or the typical generation and clearance of arc faults for a high-impedance defect can be detected by an intelligent sensor node. This will be manifested, for example, by instabilities or abrupt changes in the ratio of layer currents in the high-impedance winding short-circuit or winding fault which, over time, can develop into a low-impedance defect. Abrupt signal variations can be employed by way of a warning message, which can initiate further associations of information. Such associations can also include the response of individual fire detectors, or low-level acoustic indications which are detected by means of a microphone. The sum of indicators can then be employed as a sufficient criterion for the execution of a switch-off.

As signal paths to a monitoring device, for example for protective tripping, the following options can be employed: in a first variant, UV light can be generated by a UV light source and irradiated in the direction of the sensors of a fire protection installation. Alternatively or additionally, light can be transmitted via optical waveguides to an evaluation device at ground potential. In a second variant, an acoustic warning signal can be delivered by a loudspeaker. In a third variant, a radio signal can be transmitted. In the event of the occurrence of two of the three above-mentioned signal transmissions, the switch-off of the entire installation can be tripped. The coils, for example reactance coils, can then be carefully checked with respect to their inductance and insulation, and can be serviced if required.

The present invention permits a highly accurate and delay-free detection of high currents in a short-circuit winding of a coil, for example an air-insulated reactance coil in which alternating current, or a combination of alternating and direct currents, flow. In principle, no installation of additional wires or optical waveguides is required, thereby resulting in a cost saving. For the error-free detection of an unacceptable operating state, it is appropriate that different or independent fault detection techniques should be employed. The present invention provides a further detection technique for this purpose. Redundant signal transmission permits the secure transmission of the signal. High-performance and existing UV monitoring systems in equipment rooms with corresponding installations can not only be employed for fire detection, but can also be employed for the early detection of high currents in a defective winding of a coil, for example a reactance coil. The installation of an acoustic signal detection system in a reactance coil room also permits the detection of partial discharges, partial flashover or progressive mechanical defects in reactance coil bodies. Along sight lines which are partially constituted by metallic structures, for example in converter rooms, acoustic signal transmission, on the grounds of the effective diffraction and reflection of acoustic waves, permits reliable signal transmission. In this manner, a multiple employment of acoustic reception signals is possible, for example for different sensors or fault categories, using different acoustic error messages. This can be executed, for example, at different frequencies, or by signal modulation. Moreover, the energy of the measurement signal can be employed as a power source for transmission technology, and optionally stored, thus rendering a battery power supply superfluous.

The invention is described in greater detail hereinafter with reference to exemplary embodiments, and in consideration of the attached figures. Although the invention is illustrated and described in greater detail by the exemplary embodiments, the invention is not limited by the examples disclosed, and further variants may be inferred herefrom by a person skilled in the art, without departing from the protective scope of the invention.

The figures are not necessarily true to detail or true to scale, and may show scaled-up or scaled-down representations, in the interests of clarity. Consequently, functional details disclosed herein are not to be understood as restrictive, but only as an illustrative basis for the employment of the present invention in a variety of ways by a person skilled in this field of technology.

The expression "and/or" used herein, when employed in a series of two or more elements, signifies that each of the elements listed can be employed in isolation, or that any combination of two or more of the listed elements can be employed. If, for example, a combination is described which includes components A, B and/or C, this combination can comprise only A; only B; only C; A and B in combination; A and C in combination; B and C in combination; or A, B and C in combination.

BRIEF DESCRIPTION OF THE FIGURES

FIG. 1 shows a schematic representation of a method according to the invention for monitoring the operation of an electrical assembly, in the form of a flow diagram.

FIG. 2 shows a schematic representation of a method according to the invention for operating an electrical assembly, which comprises a plurality of coils electrically arranged in parallel, in the form of a flow diagram.

FIG. 3 shows a schematic representation of an electrical assembly according to the invention, in a perspective view.

FIG. 4 shows a schematic cross-sectional representation of a conductor bundle of a coil.

FIG. 5 shows a schematic representation of an assembly according to the invention, and of the principle of the present invention, in the form of a block diagram.

DETAILED DESCRIPTION OF THE INVENTION

FIG. 1 shows a schematic representation of a method according to the invention for monitoring the operation of an electrical assembly, in the form of a flow diagram. In the context of the method for monitoring the operation of an electrical assembly, which comprises a plurality of coils which are electrically arranged in parallel, the operating current of the assembly is detected in an optional step 11. In step 12, the voltage present on each coil is detected, e.g. measured, by means of a tap which is arranged on a winding, in an off-power arrangement. Steps 11 and 12 can also be executed in the reverse sequence, or simultaneously.

In step 13, the AC component of each respective measured voltage is determined for each coil, for example by the detection thereof. In step 14, the mean voltage value present on the coils is determined. In step 15, the AC component of each measured voltage is evaluated for each coil, in relation to the mean voltage value thus determined, wherein a weighting, for example by reference to the operating current, is applied. For example, the root mean square value and/or amplitude value and/or peak-to-peak value of the AC component determined for each coil can be divided by the operating current, or considered by way of a ratio thereto and, in this manner, a weighting can be applied for the purposes of further evaluation. Alternatively, a weighting can be applied by means of the voltage.

Additionally or alternatively, for each coil, the differential, i.e. the temporal derivative, of the AC component of the voltage measured for the respective coil can be weighted with the operating current thus detected, or a weighting with the differential of the operating current detected, i.e. the temporal derivative thereof, can be applied. Here again, the root mean square value, the amplitude value or the peak-to-peak value can be employed for the AC component.

In step 16, a check is executed as to whether the weighted deviation of a value which describes the AC component of the measured voltage in a coil, i.e. for example, the weighted value determined in step 15, for example for the root mean square value, amplitude value or peak-to-peak value, from a value which describes the mean voltage value, i.e. for example the mean voltage present on the participating coils, or the differential, or the differential of the mean value, exceeds a specified limiting value. If this is the case, in step 17, a signal output is generated, preferably on a monitoring device. If the limiting value is not exceeded, the method jumps back to step 11.

Optionally, the magnetic field of the individual coils can also be measured and the ratio of the magnetic field to the operating current and/or to the AC component of the operating current determined and, in the event that the ratio for a coil exceeds a specified threshold value, a signal output can be generated.

Signal transmission to a monitoring device can be executed by an acoustic signal transmission and/or signal transmission by means of UV light waves and/or signal transmission by means of an optical waveguide and/or signal transmission by means of a radio signal. Signal transmission is preferably executed on at least three different paths.

FIG. 2 shows a schematic representation of a method for operating an electrical assembly which comprises a plurality of, for example at least two or at least three, coils which are electrically arranged in parallel, in the form of a flow diagram. In step 21, the assembly is in regulation operation. Accordingly, an electric current is flowing in the plurality of coils. For example, a high voltage can be present on the coils. The electrical assembly can be, for example, a reactance coil or a transformer.

In step 22, a method according to the invention, for example a method described in FIG. 1, is executed. In conjunction with the output of a signal in the context of this method, a check is executed in step 23 as to whether a specified number of redundant signals have been received by a monitoring device. If this is not the case, the method jumps back to step 21. If this is the case, the operation of the assembly is interrupted in step 24 and, optionally, further measures are initiated, for example a switch-off, a servicing operation or a repair. The number of redundant signals which the monitoring device is required to receive in order to execute the transition from step 23 to step 24 can be established, for example, as the reception of at least two out of three signals.

FIG. 3 shows a schematic representation of an electrical assembly 30 according to the invention, in a partial perspective view. The assembly 30 comprises a number of coils, which are electrically arranged in a parallel circuit. The assembly 30 can be, for example, a reactance coil or a transformer. The assembly 30 comprises a bearing bracket 31. A number of coils 32 are fastened to the bearing bracket 31. In FIG. 3, only one coil is schematically represented. Further coils can be arranged concentrically within the illustrated coil 32. Each of the coils 32 comprises a main terminal 33. On the first winding 34, considered from the main terminal 33, a tap 35 is arranged. On the first winding 34, a connecting terminal 36 can be arranged, which is configured for connection to a tapping cable.

The tap 35 and/or the connecting terminal 36 are arranged adjacently to the main terminal 33. The tap 35 or the connecting terminal 36 is preferably arranged at a distance of less than one half-length of the first winding 34, for example at a distance between 20 cm and 50 cm, preferably at a distance of approximately 30 cm, from the main terminal 33.

The main terminal 33 and the tap 35 are connected to an apparatus 37 for the off-power detection, for example the measurement, of the voltage which is present between the main terminal 33 and the spur 35. The apparatus for the off-power detection of the voltage 37 which is present on the respective coil is connected to an evaluation device 38 for signal transmission. Moreover, the evaluation device 38 can optionally be connected to a device for detecting the operating current of the assembly 39 for signal transmission.

The evaluation device 38 is configured, on the basis of signals received from the apparatus for the off-power detection of the voltage 37 which is present on the individual coils and, optionally, signals from the apparatus 39 for detecting the operating current according to an above-mentioned method, described for example with reference to FIG. 1, to generate and deliver a signal output. The evaluation device 38 can be configured to transmit a corresponding signal to a monitoring device on at least two, and preferably at least three, redundant signal transmission paths.

FIG. 4 shows a schematic cross-sectional representation of a conductor bundle 40 of a coil 32. This can be a cross-sectional view of the first winding 34. The conductor elements of the conductor element bundle 40 are identified by numbers 1 to 10, and the insulation of the conductor bundle 40 is identified by reference number 41. In the configuration represented, the tap 35 is connected by means of the connecting terminal 36 to the conductor element 2, through the insulation 41. A connecting terminal 36 of this type can also be retrofitted to existing coils in a comparatively simple manner.

FIG. 5 shows a schematic representation of an assembly according to the invention, and the principle of the present invention, in the form of a block diagram. For exemplary purposes, three coils in an assembly according to the invention are identified by the reference numbers 51, 52 and 53. A device for detecting the overall current which is present on the coils is identified by the reference number 54. Each of the coils 51, 52 and 53 comprises a main terminal 33 and a tap, preferably with a connecting terminal 36.

Each of the coils 51, 52 and 53 is connected to an apparatus 37 for detecting the voltage which is present between the respective main terminal 33 and the spur 35. Each of the apparatuses 37 for the purposes of signal transmission, represented by arrows, is connected to the evaluation device 38. The evaluation device 38 which, optionally, is also configured to receive signals from the device for detecting the overall current 39, is configured, according to the above-mentioned method according to the invention, to generate and deliver a signal output. Output of the signal can optionally be executed on a monitoring device 54.

LIST OF REFERENCE SYMBOLS 1-10 Conductor elements
11 Detection of the operating current of the assembly
12 Off-power detection of the voltage present on each coil
13 Determination of the AC component of the measured voltage on each coil
14 Determination of the mean voltage value present on the coils
15 Evaluation of the AC component for each coil, in relation to the mean voltage value thus determined
16 Overshoot of a specified limiting value by the weighted deviation of a value which describes the AC component of a measured coil voltage from a value which describes the mean voltage value?
17 Signal output
21 Operation of the assembly
22 Execution of monitoring method
23 Check as to whether a specified number of redundant signals have been received on a monitoring device
24 Interruption of operation
30 Electrical assembly 31 Bearing bracket
32 Coils
33 Main terminal
34 First winding
35 Tap
36 Connecting terminal
37 Apparatus for the off-power detection of the voltage which is present on the respective coil
38 Evaluation device
39 Device for detecting the operating current
40 Conductor bundle
41 Insulation
51 Coil
52 Coil
53 Coil
54 Monitoring device
J Yes
N No

The invention claimed is:

1. A method for monitoring an operation of an electrical assembly including a plurality of coils disposed electrically in a parallel circuit, the method comprising:
using a tap on a winding for off-power detection of a voltage at each coil;
determining an AC component of the detected voltage for each coil;
determining a mean value of the voltage at the coils;
evaluating the AC component for each coil with respect to the determined mean voltage value and applying a weighting; and
generating a signal output upon a weighted deviation of a value, describing the AC component of the voltage detected in a coil, from a value describing the mean voltage, exceeding a specified limiting value.

2. The method according to claim 1, which further comprises providing each of the coils with a main terminal, carrying out the off-power detection of the voltage at each coil between the main terminal and the tap, and placing the tap on a first winding starting from the main terminal.

3. The method according to claim 2, which further comprises placing the tap at a maximum distance of two-thirds of a conductor length of the first winding starting from the main terminal.

4. The method according to claim 1, which further comprises at least one of:
detecting and employing an operating current of the assembly for weighting, or
applying a weighting by reference to an absolute value of a voltage tap measurement or by reference to a mean value of voltages measured on the taps.

5. The method according to claim 1, which further comprises:
determining the value describing the AC component of the voltage detected in a coil as at least one of a root mean square value or an amplitude value or a peak-to-peak value of the AC component or a temporal variation of the deviation of the detected voltage from the mean value; and
determining the value describing the mean voltage as at least one of a mean value of a DC voltage component or a mean value of root mean square values of the AC voltage components on individual coils or a mean of amplitude values or a mean of peak-to-peak values or a temporal variation of the mean voltage value.

6. The method according to claim 1, which further comprises at least one of:
detecting and employing an AC component of an operating current for weighting or determining a ratio of a deviation of a value describing an AC component of a measured coil voltage from a value describing a mean voltage, relative to the AC component of the operating current; and
generating a signal output upon the ratio exceeding a stipulated limiting value.

7. The method according to claim 1, which further comprises measuring a magnetic field of individual coils, determining a ratio of the magnetic field to at least one of an operating current or an AC component of the operating current, and generating a signal output upon the ratio for a given coil achieving a stipulated threshold value.

8. The method according to claim 1, which further comprises at least one of rectifying or smoothing a signal describing the AC voltage component or a signal describing an AC component of a detected operating current.

9. The method according to claim 1, which further comprises transmitting at least one signal to a monitoring device over a plurality of redundant signal transmission paths.

10. The method according to claim 1, which further comprises using an induction coil to recover energy from an alternating coil field and employ the recovered energy for at least one of an evaluation or a generation of signals or a transmission of signals.

11. An electrical assembly, comprising:
a plurality of coils electrically disposed in a parallel circuit, each of said coils having a tap on one winding;
an evaluation device; and
an apparatus for an off-power detection of a voltage at each coil by using said tap;
the assembly configured to carry out the method according to claim 1.

12. The assembly according to claim 11, which further comprises at least one induction coil for a recovery of energy.

13. The assembly according to claim 11, wherein:
each of said coils includes a main terminal;
said winding is a first winding starting from said main terminal;
said tap is disposed on said first winding; and
said apparatus for the off-power detection of the voltage at each coil is configured to detect a voltage between said main terminal and said tap.

14. The assembly according to claim 13, wherein said tap is disposed at a distance of no more than two-thirds of a conductor length of said first winding starting from said main terminal.

15. The assembly according to claim 11, which further comprises a bearing bracket to which said coils are fastened, said taps being configured to be led out of said coils in a direction of said bearing bracket.

16. The assembly according to claim 11, which further comprises at least one of a signal-damping reactance coil or a surge arrester.

17. A method for operating an electrical assembly, the method comprising:
providing an electrical assembly including a plurality of coils electrically disposed in a parallel circuit, each of said coils having a tap on one winding, an evaluation device, and an apparatus for an off-power detection of a voltage at each coil by using said tap and said evaluation device;
operating the electrical assembly;
carrying out the monitoring method according to claim 1; and interrupting the operation of the electrical assembly during the monitoring method upon delivering at least one signal output to a monitoring device, the at least one signal output having been received from the monitoring device over at least two redundant transmission paths.

* * * * *